(12) United States Patent
Amorim

(10) Patent No.: US 6,817,886 B2
(45) Date of Patent: Nov. 16, 2004

(54) THROUGH-PANEL MOUNTED COMPONENT

(75) Inventor: Goncalo Agra Amorim, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 19 days.

(21) Appl. No.: 10/357,010

(22) Filed: Feb. 3, 2003

(65) Prior Publication Data

US 2003/0176102 A1 Sep. 18, 2003

(30) Foreign Application Priority Data

Mar. 16, 2002 (EP) .......................................... 02251898

(51) Int. Cl.[7] .............................................. H01R 13/64
(52) U.S. Cl. ..................................... 439/377; 439/923
(58) Field of Search ............................. 439/152, 155, 439/374, 377, 923

(56) References Cited

U.S. PATENT DOCUMENTS

| | | | |
|---|---|---|---|
| 5,966,289 A | 10/1999 | Hastings et al. ............ | 361/704 |
| 6,102,720 A | * 8/2000 | Tung ........................... | 439/159 |
| 6,485,322 B1 | * 11/2002 | Branch et al. ............... | 439/357 |
| 6,587,348 B2 | * 7/2003 | Kondo ........................ | 361/741 |
| 6,648,693 B1 | * 11/2003 | Hogan et al. ................ | 439/630 |

FOREIGN PATENT DOCUMENTS

| EP | 1182743 A1 | 2/2002 |
|---|---|---|
| FR | 27278109 | 6/1996 |

* cited by examiner

Primary Examiner—Khiem Nguyen

(57) ABSTRACT

A through-panel apparatus includes a device with at least one through-panel receptacle and at least one component removably mounted to the device by inserting the component through the receptacle. Both the device and component have between them electrical and/or optical connections that are made when the component is mounted to the device, and broken when the component is demounted from the device. To break the connections requires the application of an extraction force in a direction opposite to that of insertion of the device through the receptacle. The component has a sprung mechanism that is biased against the device when an insertion force is applied to the component along the direction of insertion during mounting of the component to the device. The biasing of the sprung mechanism provides a spring bias force that contributes to the required extraction force to aid extraction of the component from the receptacle.

18 Claims, 4 Drawing Sheets

THROUGH-PANEL MOUNTED COMPONENT

The present invention relates to a removable through-panel mounted component, for example, an electrical or opto-electronic module to which connections are made when the module is plugged into a receptacle in a panel.

Many types of devices have a panel with apertures, gaps or slots through which a component may be mounted to the device. The present invention is concerned with the case when electrical and/or optical connections are made between the device and the component when the component is removably connected to the device through an aperture, slot, gap, or other such discontinuity in an accessible surface, face or other such panel of the device. Such components are referred to herein as "removable through-panel mounted components".

After such a connection of the component to the device, it may be necessary to remove the component from the device, for example, if the component develops a fault, or if the device needs to be reconfigured with different components.

With increasing integration and sophistication of electronic or opto-electronic modules, there may be many electrical or optical connections between the device and component when these are connected together. In some applications, it is desirable to have many such components mounted close together, for example in a close-packed two-dimensional array of similar components mounted through a planar front panel of a 19" rack-mounted device. It is also generally desirable for the sake of compactness for the components not to protrude unduly from a panel. These factors—closely packed components, a large number of electrical and/or optical connections, and low protruding components—makes it ever more difficult to disconnect and extract a component when this has to be demounted from the device. While it may always be possible to provide specialist tools to facilitate removal of the component from the device, this may be perceived as inconvenient by the user of the device, particularly if a device has to be quickly replaced.

It is an object of the present invention to provide a more convenient removable through-panel mounted component.

According to the invention, there is provided a through-panel apparatus, comprising a device with at least one through-panel receptacle, and at least one component, said component being removably mounted to the device by inserting the component through said receptacle, both the device and said component mounted to the device having electrical and/or optical connections between the device and said component, said connections being made when said component is mounted to the device and broken when said component is demounted from the device, and said connections requiring in order to be broken the application of an extraction force in a direction opposite to that of insertion of the device through the receptacle, characterised in that the component has a sprung mechanism that is biased against the device when an insertion force is applied to said component along the direction of insertion during mounting of said component to the device, the biasing of the sprung mechanism then providing a spring bias force that contributes to said required extraction force to aid extraction of said component from the receptacle when said component is to be demounted from the device.

The sprung mechanism therefore stores energy exerted during insertion and mounting of the component to the device in order to reduce the forces that need to applied externally of the device in order to demount the component.

In a preferred embodiment of the invention, the component when inserted into the receptacle engages slideably with the device along a pair of rails, said spring bias force then acting in a direction that lies in a plane defined by the sliding orientation of said rails. This provides the benefit that the extraction force provided by the sprung mechanism is acting in the most efficient manner. In this way, all the force provided by the sprung mechanism may be available to assist the sliding motion of the device along the rails.

One economical way in which rails can be formed is by using for the rails printed circuit board edges, preferably opposing edges of a single printed circuit board.

The opposing edges will be separated by a gap, which then may provide an opening in the plane of the circuit board into which said component is inserted when mounted to the device.

Opposite this opening another edge of the circuit board may extend between the rails thereby spanning this gap between said pair of rails.

The spring bias force may act against an edge of the printed circuit board, for example, the edge of the circuit board that spans the gap between the pair of rails.

In a preferred embodiment of the invention, the component may have a pair of tracks, each rail being slideably engaged in one of said tracks. At least one of the tracks may be used to make one or more electrical contacts from the component to the device when the component is mounted to the device. With components using radio-frequency signals, it is particularly advantageous if the tracks are used to make ground contacts for grounding an external chassis of the component.

One form of sprung mechanism is bumper-type spring that extends across an outer surface of said component. This type of spring is compressed by contact with an end stop surface of the device as the component is mounted to the device. The tracks can then be connected together by the sprung mechanism.

The sprung mechanism may include one or more helical springs or a resilient strip that is deformed to store energy as the component is mounted to the device.

The invention will now be described in greater detail, and by way of example only, with reference to the accompanying drawings, in which.

Figure 1:
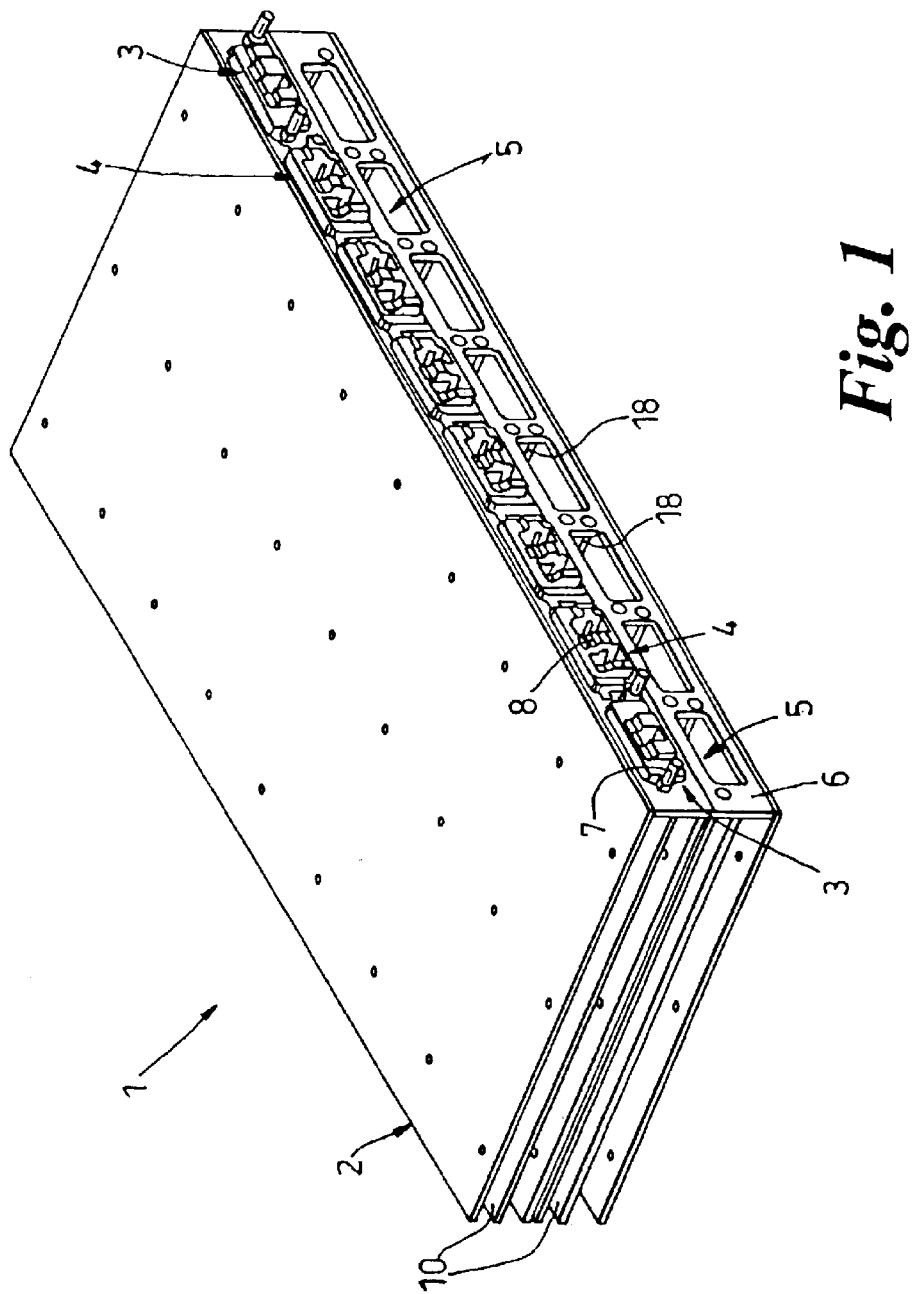
FIG. 1 shows a through-panel apparatus according to one embodiment of the invention, comprising a fibre optic communication device having a front panel with a two-dimensional array of receptacles, an upper row of the receptacles being filled with optical fibre transceiver components or transmitter components.

FIG. 1 shows a through-panel apparatus 1 comprising a fibre optic communication device 2 and a number of optical fibre transmitter components 3 and optical fibre transceiver components 4. Each of the components 3,4 is mounted to the device 2 by inserting the component 3,4 into one of a plurality of receptacles 5 in a front panel 6 of the device 2. Each component 3,4 is then secured to the device by tightening one or more conventional tie-down bolts 7 or screws 8. The bolts 7 or screws 8 can be loosened if it becomes necessary to remove one of the components 3,4 from a receptacle 5, for example if a component fails or needs to be changed for a different type of component.

Figure 2:
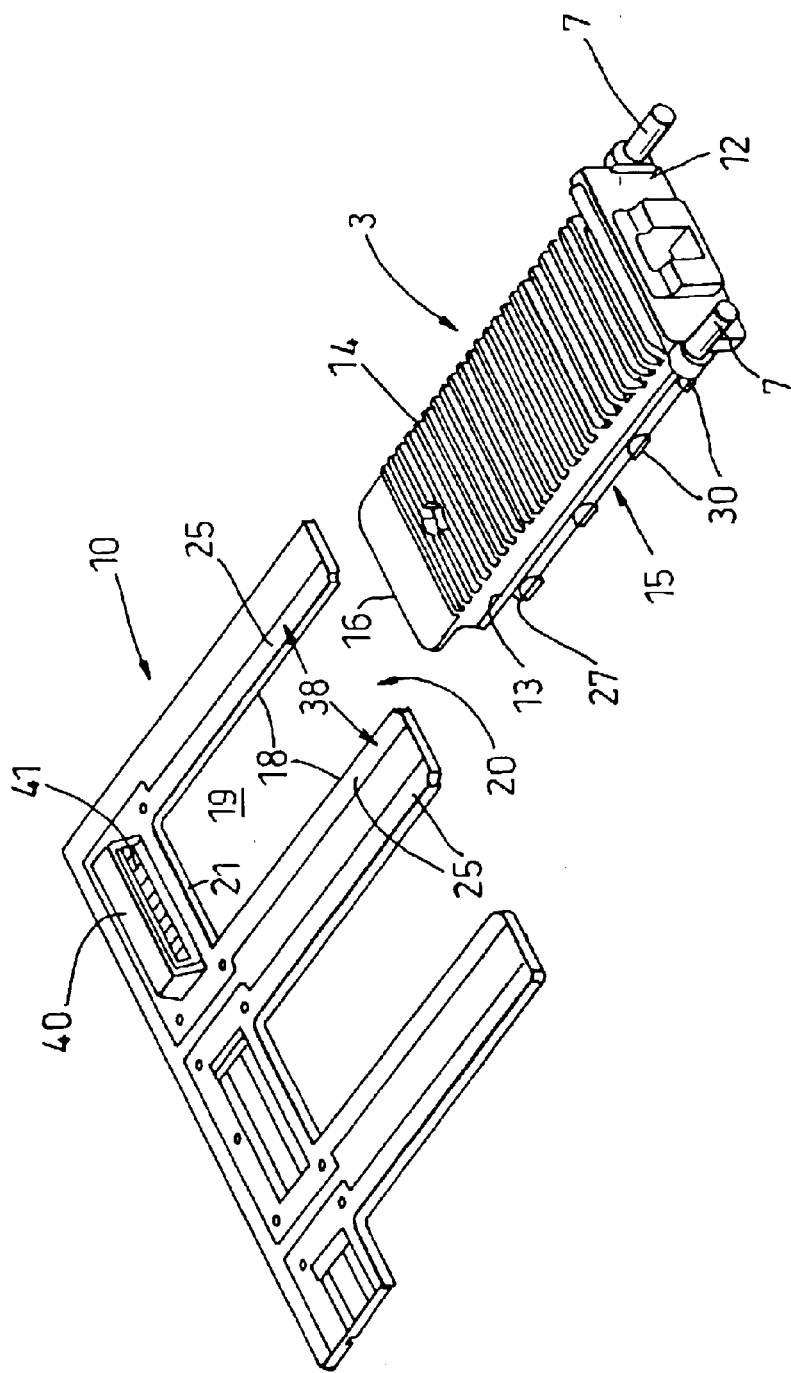
FIG. 2 shows a perspective view from above one of the transmitter components of FIG. 1, aligned with a printed circuit board connector from within the fibre optic communications device, the board having a pair of parallel rails for mounting each of the components.

FIG. 2 shows one of the transmitter components 3 and how this component is aligned with respect to a printed circuit board 10 within the device 2 prior to insertion of one of the transmitter components 3 through one of the receptacles 5. The external construction and mounting of the transceiver components 4 is the same as that for the transmitter component 3, and so will not be described separately.

Each transmitter component 3 is generally rectangular in plan form, having at a short end of this rectangular plan form a face plate 12 that is nearly flush with the front panel 6 of the device 2 when the component 3 is mounted to the device. Extending over long sides 13,14 of the device 2 are a pair of similar parallel tracks 15 that extend from just behind the front panel 12 towards a rear connector end 16 of the device 3. The printed circuit board 10 is unitary in construction, and has for each receptacle 5 a pair of parallel straight edges 18. The edges 18 define a gap 19 in the circuit board 10. The gap 19 has at one end an opening 20 aligned with one of the receptacles 5, and at another end a straight edge 21 that extends transversely between the parallel edges 18.

Figure 3:
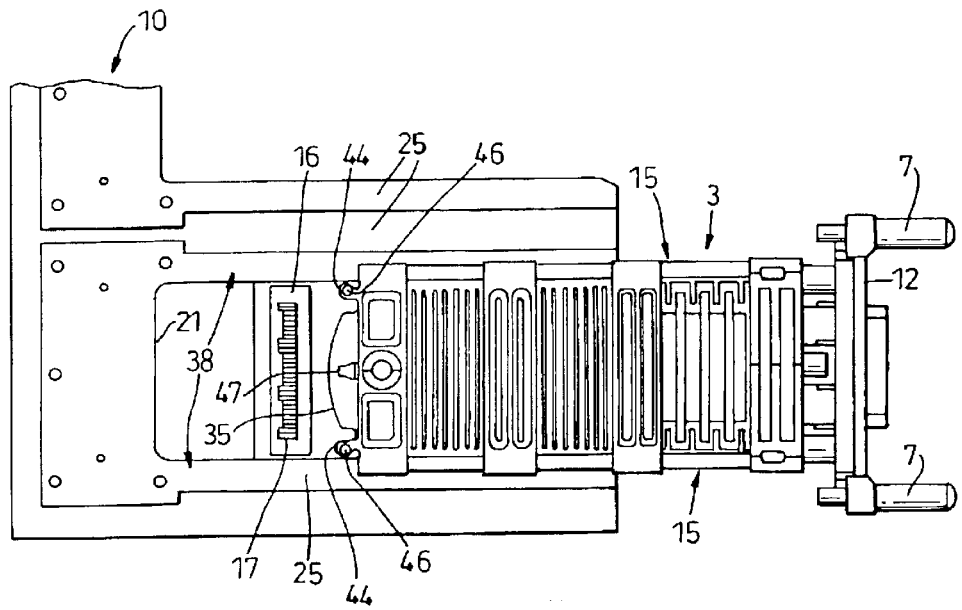
FIGS. 3 and 4 shows respectively plan and perspective views from below of the component and printed circuit board of FIG. 2, with the component partially mounted to the board by means of a pair of parallel tracks that run along opposite sides of the component.
Figure 4:
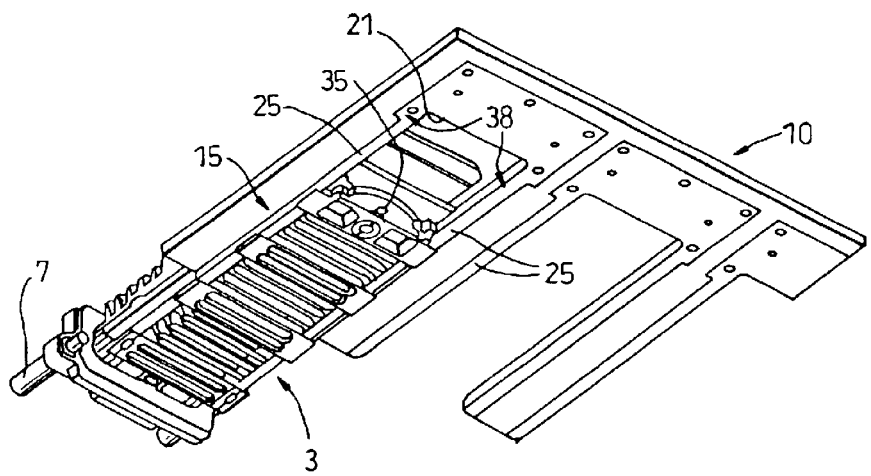

The tracks 15 have a square U-shaped cross-section and have an open end 27. The separation between the edges 18 is set so that each edge 18 engages in one of the track open ends 27, and then slides inside the track 15 when the component 3 is inserted through one of the receptacles 5. This is shown in FIGS. 3 and 4, where the component 3 is partially inserted, and in FIG. 5 where the component 3 is nearly fully inserted.

A ground strip 25 is plated on both sides of the printed circuit board 10 along the full extent of the parallel edges 18.

Figure 6:
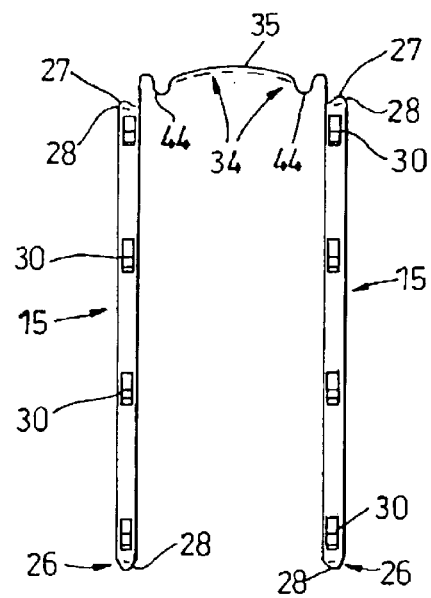
FIGS. 6, 7 and 8 are, respectively, plan, side and end views of a combined track and sprung mechanism used in the components of FIGS. 1 to 5.
Figure 7:
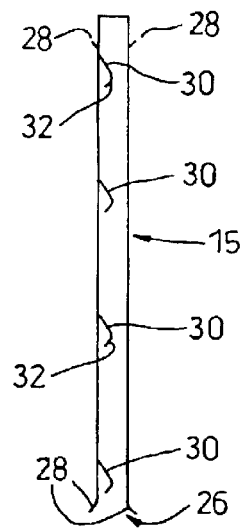
Figure 8:
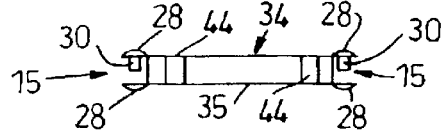

With reference now also to FIGS. 6, 7 and 8, each track 15 has a square U-shape profile, with the open end of the U facing towards a similar square section profile of the corresponding edge 18. Each track 15 also has open front 26 and rear 27 ends with outwardly directed lips 28 to ensure that the ends 26,27 do not snag with the ground planes 25 running the length of the edges 18.

Each track has a plurality of inwardly directed fingers 30 that are connected to the track 15 at the base of each finger 30, and that extend into the U-section profile of each track 15. Each finger 30 has a rounded forward edge 32 so that when one of the parallel edges 18 of the circuit board 10 is inserted into the front end 26 of a track 15, each finger 30 in turn rides over one of the ground plane strips 25 so that a good electrical contact is made between the track and the ground plane 25.

The tracks 15 are made from nickel plated hardened steel, and the fingers 30 remain resiliently biased against the ground strips 25 while the component 3 is mounted to the device 2.

The component 3 includes a sprung mechanism 34, in the form of a strip of steel that extends generally transversely between the tracks 15 from the inner end 27 of each track 15. The tracks 15 and sprung mechanism 34 are all formed from a single piece of die-cut and folded sheet steel, so that together the tracks 15 and sprung mechanism 34 form a unitary device for mounting the transmitter device 3 to the fibre optic communication device 2, and for making both a good ground connection with the ground strips 25, and also providing a release assist mechanism to aid demounting of the component 3 from the fibre optic communication device 2, as will be explained in more detail below.

Figure 5:
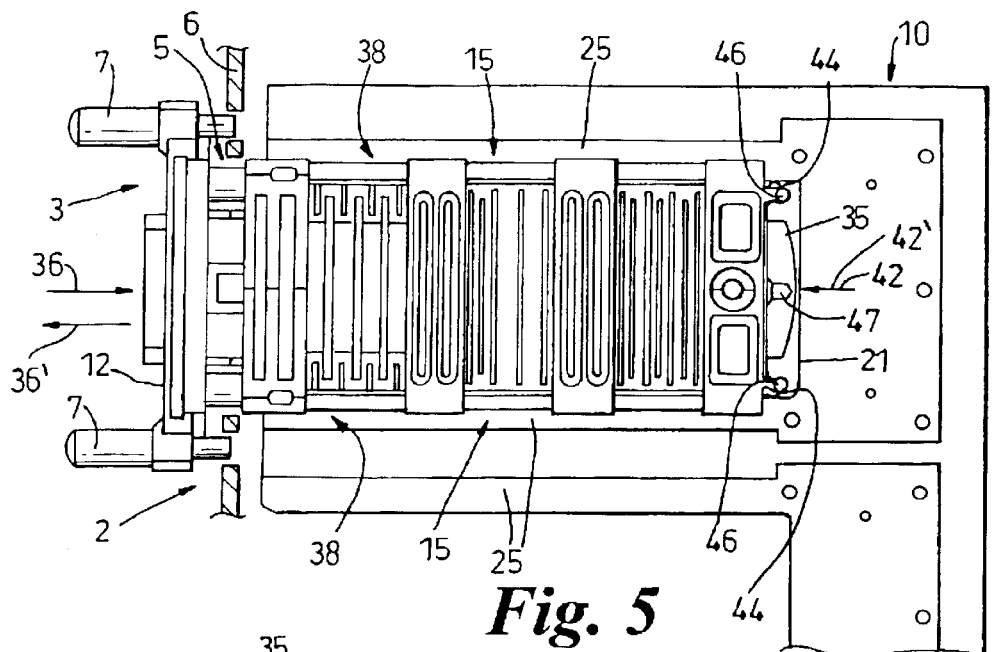
FIG. 5 shows how a sprung mechanism extending along an inner end of the component becomes compressed as the component is fully mounted to the device.

As shown most clearly in FIG. 5, as an insertion force 36 is applied to the front panel 12 of the component 3, the component 3 slides fully along the edges 18, which therefore act as a pair of rails 38 for the corresponding tracks 15. The required force 36 to insert the component 3 increases as each finger 30 makes contact with the ground strip 25. As the component 3 nears full insertion, the rear connector end 16 of the component 3 comes into contact with an electrical connector block 40 that is mounted on the circuit board 10 immediately behind the end stop edge 21 of the gap 19. A considerable increase in the insertion force 36 is then required to make the final electrical connections between the connector end 16 of the component and the terminal block 40. Whilst this force 36 is relatively easy to apply during insertion of the component into the receptacle 5, particularly if tie-down bolts 7 are turned to press the front panel 12 fully towards the face plate 6, it is considerably more difficult to apply an equivalent extraction force 36' to demount the component 3 from the recess 5. This is particularly the case given the nearly flush arrangement between the front face 12 of each component 3 and the front panel 6, and the closely spaced arrangement of adjacent components 3 on the front panel 6.

As FIG. 5 shows, when the component 3 is nearly fully mounted, the sprung mechanism 34 comes into contact with the end stop edge 21. The end stop edge 21 then provides a compression force 42 to deform a central resilient strip 35 of the sprung mechanism 34. The strip 35 is a bumper-type spring that extends across a rear portion of the component 3. Although the strip 35 is made from relatively thin steel, for example 0.2 mm to 0.5 mm thick steel, it is possible for such a strip to store sufficient energy to aid retraction of the component if the strip 35 is formed with a relatively shallow outwards bow, for example a bow with a width to depth ratio of between 10:1 and 5:1, and if the ends of such a bow are restrained from moving transversely outwards upon application of the compressive force 42 against the strip 35.

The sprung mechanism 34 therefore is provided with a pair of S-shaped regions 44 either side of the shallow bow 35 that engage with two projecting features 46 on the rear connector end 16 of the component 3.

A third similar projection 47 on the centre of the rear connector end 16 of the component 3 faces outwards towards the bow 35. As the component 3 is fully inserted, the bow 35 is compressed up against this central projection 47 which then makes a solid contact between the component 3 and printed circuit board 10 in the insertion direction, thereby preventing further insertion of the component 3 into the receptacle 5. The projection 47 therefore acts as an insertion limiting feature.

In the present example, the component is about 100 mm long, 35 mm wide, and 15 mm thick. The printed circuit board 10 is between about 1.8 to 2.9 mm thick. The combined track/sprung mechanism is formed from spring sheet steel having a thickness of 0.25 mm, with the U-shaped tracks 15 and sprung mechanism 34 being about 3 mm wide.

In the absence of the sprung mechanism, the extraction force for the component 3 when being demounted would be about 10 N. The sprung mechanism compression force 42, and hence extraction force 42' that can be provided by the sprung mechanism, is about 7 N. The total insertion force 36 is therefore about 17 N. An insertion force 36 of 17 N can readily be provided by hand, and the resultant extraction force 36' of 3 N is sufficiently low so that there is no need to use any special tools or devices to get a firm grip of the component 3 when this is being demounted. The invention therefore provides a convenient removable through-panel component for use with a device having suitable receptacles for such a component.

What is claimed is:

1. A through-panel apparatus, comprising a device with at least one through-panel receptacle, and at least one component, said component being removably mounted to the device by inserting the component through said receptacle, both the device and said component mounted to the device having electrical and/or optical connections between the device and said component, said connections being made when said component is mounted to the device and broken when said component is demounted from the device, and said connections requiring in order to be broken the application of an extraction force in a direction opposite to that of insertion of the device through the receptacle, wherein the component has a sprung mechanism that is biased against the device when an insertion force is applied to said component along the direction of insertion during mounting of said component to the device, the biasing of the sprung mechanism then providing a spring bias force that contributes to said required extraction force to aid extraction of said component from the receptacle when said component is to be demounted from the device, wherein the component when inserted into the receptacle engages slideably with the device along a pair of rails, said spring bias force then acting in a direction that lies in a plane defined by the sliding orientation of said rails, wherein the rails are printed circuit board edges.

2. A through-panel apparatus as claimed in claim 1, in which the rails are parallel with each other.

3. A through-panel apparatus as claimed in claim 1, in which the rails are provided on opposing edges of a single printed circuit board.

4. A through-panel apparatus as claimed in claim 3, in which said pair of opposing edges are separated by a gap, said gap having an opening in the plane of the circuit board into which said component is inserted when mounted to the device.

5. A through-panel apparatus as claimed in claim 4, in which said gap is spanned opposite said opening by an edge of the circuit board that extends between said pair of rails.

6. A through-panel apparatus as claimed in claim 1, in which said spring bias force acts against an edge of a printed circuit board.

7. A through-panel apparatus as claimed in claim 5, in which said spring bias force acts against an edge of a printed circuit board.

8. A through-panel apparatus as claimed in claim 7, in which said spring bias force acts against said edge of the circuit board that extends between said pair of rails.

9. A through-panel apparatus as claimed in claim 1, in which the component has a pair of tracks, each track being slideably engaged with one of said rails.

10. A through-panel apparatus as claimed in claim 9, in which there are one or more electrical contacts from at least one rail are mate to the device when said component is mounted to the device.

11. A through-panel apparatus as claimed in claim 10, in which said electrical contact(s) is/are ground contacts for grounding an external chassis of the component.

12. A through-panel apparatus as claimed in claim 10, in which the sprung mechanism includes a bumper-type spring that extends across an outer surface of said component and which is compressed by contact with an end stop surface of the device as said component is mounted to the device, said tracks being connected together by the sprung mechanism.

13. A through-panel apparatus as claimed in claim 1, in which during insertion of said component through the receptacle, the sprung mechanism becomes compressed by contact with an end stop surface of the device that in use limits the insertion of said component through the receptacle.

14. A through-panel apparatus as claimed in claim 13, in which the sprung mechanism includes a bumper-type spring that extends across a portion of said component.

15. A through panel apparatus as claimed in claim 13, in which the sprung mechanism includes one or more helical springs.

16. A through-panel apparatus as claimed in claim 12, in which the bumper-type spring extends between two features on an external surface of said component, said features acting when the sprung mechanism is biased to limit the movement of the bumper-type spring in a direction transverse the direction of insertion of the device through the receptacle.

17. A through-panel apparatus as claimed in claim 12, in which the bumper-type spring includes a resilient strip of material that bows away from an outer surface of said component towards said end stop surface.

18. A through-panel apparatus as claimed in claim 17, in which an insertion limiting feature is provided on an outer surface of said component, said insertion limiting feature coming into contact with said strip of material to stop further insertion of said device through the receptacle as the sprung mechanism is compressed by relative movement of said component and the end stop surface.

* * * * *